(12) United States Patent
Nitta et al.

(10) Patent No.: US 6,870,772 B1
(45) Date of Patent: Mar. 22, 2005

(54) NONVOLATILE SEMICONDUCTOR MEMORY DEVICE

(75) Inventors: Fumihiko Nitta, Hyogo (JP); Shinichi Kobayashi, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/660,789

(22) Filed: Sep. 12, 2003

(51) Int. Cl.$^7$ .............................................. G11C 11/34
(52) U.S. Cl. .............................. 365/185.22; 365/185.2
(58) Field of Search .................... 365/185.22, 185.2

(56) References Cited

U.S. PATENT DOCUMENTS 4,090,258 A * 5/1978 Cricchi ....................... 365/184

FOREIGN PATENT DOCUMENTS

| JP | 1-263998 | 10/1989 |
| JP | 7-169287 | 7/1995 |
| JP | 10-228784 | 8/1998 |
| JP | 10-228786 | 8/1998 |

* cited by examiner

*Primary Examiner*—M. Tran
(74) *Attorney, Agent, or Firm*—McDermott Will & Emery LLP

(57) ABSTRACT

In a flash memory, a threshold voltage of a memory transistor is decreased quickly by increasing a rising speed of a pulse voltage of an erasing pulse signal train during the first period of an erasing operation. In response to the threshold voltage of the memory transistor becoming lower than a threshold voltage of a reference transistor, the threshold voltage of the memory transistor is decreased slowly by reducing the rising speed of the pulse voltage of the erasing pulse signal train. Therefore, the erasing time can be reduced and depletion of the memory transistor can be prevented.

10 Claims, 17 Drawing Sheets

FIG.2A  READING
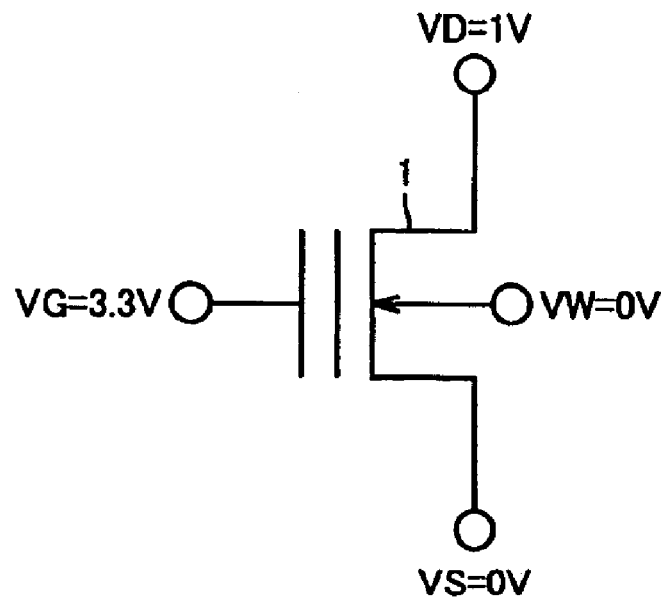
FIG.2B
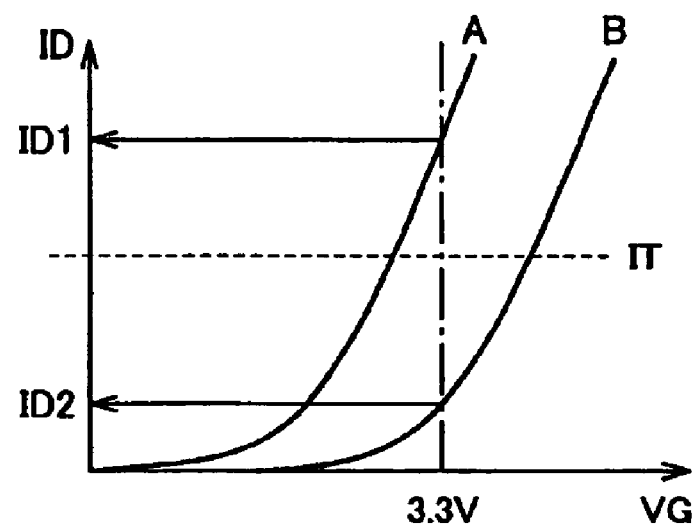

FIG.3A  WRITING
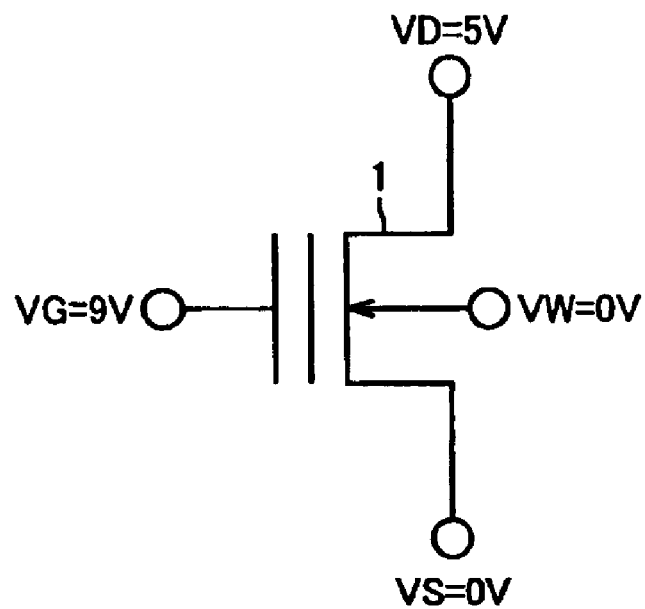
FIG.3B
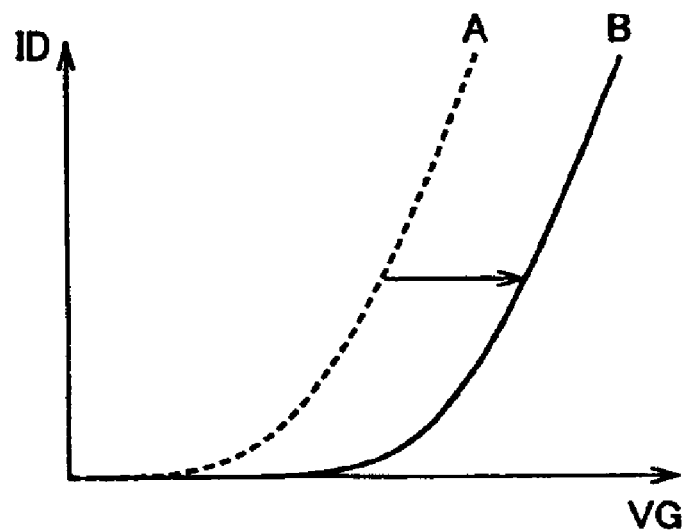

FIG.4A ERASING
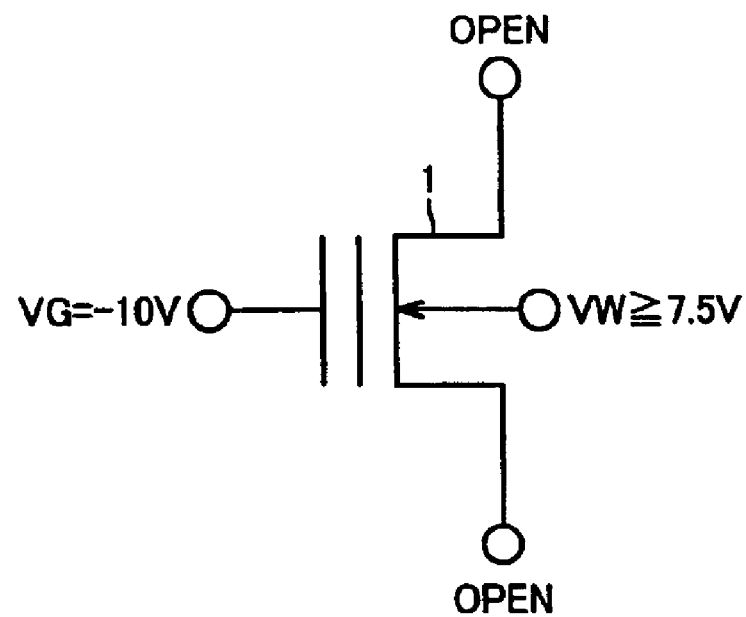
FIG.4B
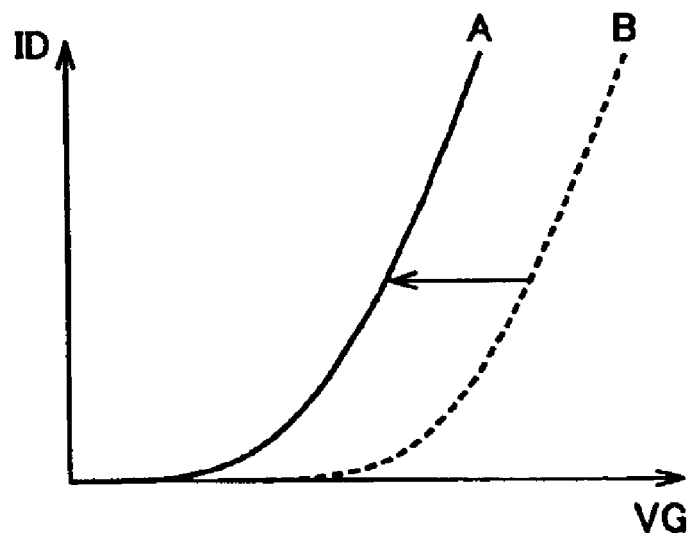

NONVOLATILE SEMICONDUCTOR MEMORY DEVICE

BACKGROUND OF THE INVENTION

1. Field of the Invention

The present invention relates to a nonvolatile semiconductor memory device, and more particularly to a nonvolatile semiconductor memory device including a memory transistor having a floating gate.

2. Description of the Background Art

Conventionally, in a flash memory, data is written by injecting electrons into a floating gate of a memory transistor and setting a threshold voltage of the memory transistor high (storing data "0"), while data is erased by removing electrons from the floating gate of the memory transistor and setting the threshold voltage of the memory transistor low (storing data "1").

In such a flash memory, if the erasing condition is weak, it takes longer time to erase data, thereby reducing the operation speed. On the contrary, if the erasing condition is too strong, the threshold voltage is excessively decreased to cause an increased number of depleted memory transistors, thereby resulting in erroneous reading.

There has been proposed a method of preventing depleted memory transistors by reducing a pulse voltage of an erasing pulse in response to a threshold voltage of a memory transistor attaining a verify voltage (Japanese Patent Laying-Open No. 10-228786).

In this erasing method, however, variations in erasing time between chips or memory blocks cannot be reduced. In addition, the erasing time is long.

SUMMARY OF THE INVENTION

A main object of the present invention is therefore to provide a nonvolatile semiconductor memory device with little variations in erasing time without causing depletion in memory transistors.

Another object of the present invention is to provide a nonvolatile semiconductor memory device with a shorter erasing time without causing depletion in memory transistors.

In accordance with an aspect of the present invention, a nonvolatile semiconductor memory device: a memory transistor having a floating gate and a control gate successively formed above a first well region of the semiconductor substrate, having its threshold voltage set to a first voltage for storing a data signal at a first logic level, and having its threshold voltage set to a second voltage for storing a data signal at a second logic level; a reference transistor having a floating gate and a control gate successively formed above a second well region of the semiconductor substrate, and having its threshold voltage set to a reference voltage between the first and second voltages; a read circuit reading the threshold voltages of the memory transistor and the reference transistor; a comparison circuit comparing the threshold voltage of the memory transistor read by the read circuit with the threshold voltage of the reference transistor read by the read circuit and outputting a pulse waveform instruction signal based on a comparison result; and a data signal rewriting circuit supplying a pulse signal train having a pulse waveform in accordance with the pulse waveform instruction signal between the control gate of the memory transistor and the first well region and changing the threshold voltage of the memory transistor from the first voltage to the second voltage. Since the pulse waveform is switched in response to the threshold voltage of the memory transistor attaining the reference voltage, depletion of memory transistors can be prevented. Furthermore, since the memory transistor and the reference transistor have the same configuration and their characteristics vary similarly, the effects of the characteristic variations of the memory transistor and the reference transistor are cancelled out, thereby reducing the variations in erasing time.

In accordance with another aspect of the present invention, a nonvolatile semiconductor memory device includes: a reference transistor and a memory transistor, each having a floating gate and a control gate successively formed above a well region of the semiconductor substrate, having its threshold voltage set to a first voltage for storing a data signal at a first logic value, and having its threshold voltage set to a second voltage for storing a data signal at a second logic level; a read circuit reading the threshold voltage of the reference transistor; a comparison circuit comparing the threshold voltage of the reference transistor read by the read circuit with a reference voltage between the first and second voltages and outputting a pulse waveform instruction signal based on a comparison result; and a data signal rewriting circuit supplying a pulse signal train having a pulse waveform in accordance with the pulse waveform instruction signal between the control gate of each of the reference transistor and the memory transistor and the well region and changing each of the threshold voltages of the reference transistor and the memory transistor from the first voltage to the second voltage. Therefore, since the pulse waveform is switched in response to the threshold voltage of the memory transistor attaining the reference voltage, depletion of the memory transistor can be prevented. Furthermore, since the memory transistor and the reference transistor have the same configuration and their characteristics vary similarly, the effects of the characteristic variations of the memory transistor and the reference transistor are cancelled out, thereby reducing the variations in erasing time.

In accordance with a further aspect of the present invention, a nonvolatile semiconductor memory device includes: a memory transistor having a floating gate and a control gate successively formed above a first well region of the semiconductor substrate, having its threshold voltage set to a first voltage for storing a data signal at a first logic level, and having its threshold voltage set to a second voltage lower than the first voltage for storing a data signal at a second logic level; a first read circuit reading the threshold voltage of the memory transistor; a voltage generation circuit generating a third voltage between the first and second voltages; a comparison circuit comparing the threshold voltage of the memory transistor read by the first read circuit with the third voltage generated by the voltage generation circuit, outputting a first pulse waveform instruction signal, if the threshold voltage of the memory transistor is between the first and third voltages, and outputting a second pulse waveform instruction signal, if the threshold voltage of the memory transistor is between the third and second voltages; and a data signal rewriting circuit supplying a pulse signal train between the control gate of the memory transistor and the first well region and decreasing the threshold voltage of the memory transistor from the first voltage to the second voltage. The data signal rewriting circuit keeps a pulse signal interval constant, continuously raises an amplitude voltage of the pulse signal train by a prescribed value per one pulse signal, sets each pulse signal width at a first width, if the first pulse waveform instruction signal is output from the comparison circuit, and sets each pulse signal width at a second width greater than the first width, if the second pulse waveform instruction signal is output from the comparison circuit. Therefore, since the rising speed of the amplitude voltage of the pulse signal train is initially increased and the rising speed of the amplitude voltage of the pulse signal train is decreased in response to the threshold voltage of the memory transistor attaining the third voltage, depletion of the memory transistor can be prevented and the erasing time can be reduced.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 2A and 2B illustrate a method of reading data in the memory transistor shown in FIG. 1.

FIGS. 3A and 3B illustrate a method of writing data in the memory transistor shown in FIG. 1.

FIGS. 4A and 4B illustrate a method of erasing data in the memory transistor shown in FIG. 1.

DESCRIPTION OF THE PREFERRED EMBODIMENTS

[First Embodiment]

Figure 1:
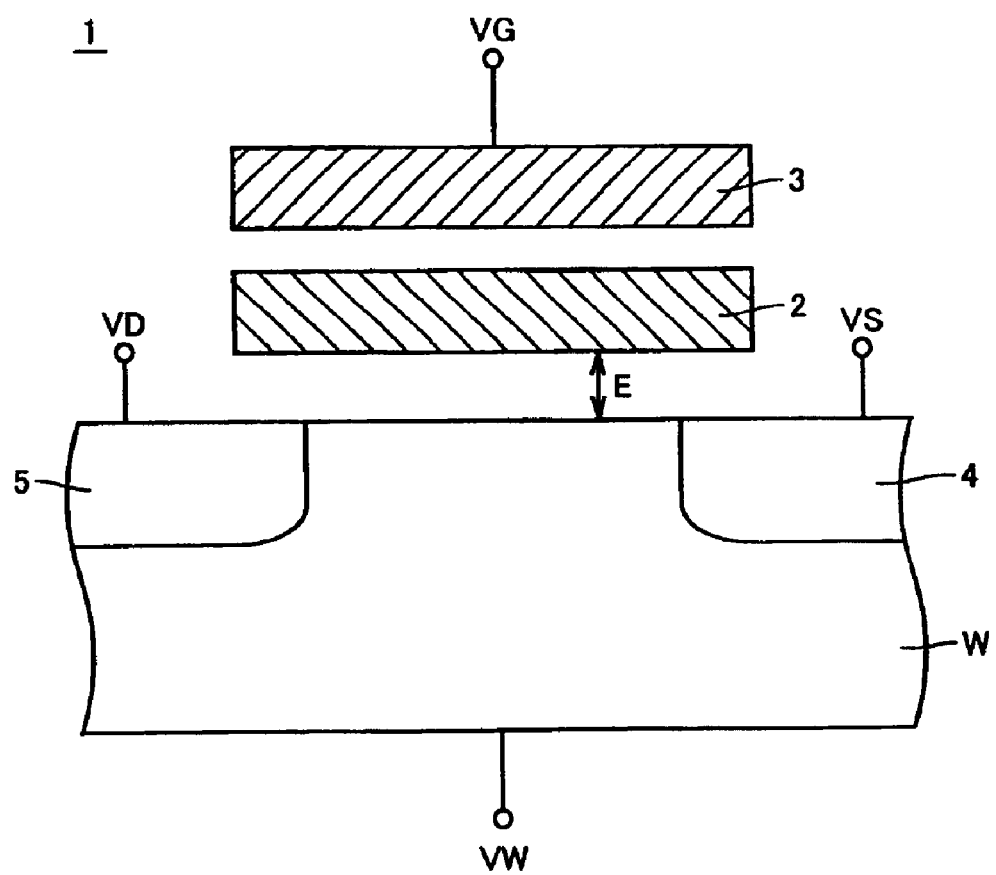
FIG. 1 is a cross sectional view showing a configuration of a memory transistor of a flash memory in accordance with a first embodiment of the present invention.

FIG. 1 is a cross sectional view showing a configuration of a memory transistor 1 of a flash memory in accordance with a first embodiment of the present invention. In FIG. 1, this memory transistor 1 includes a floating gate 2 formed above a surface of a well W at a semiconductor substrate with an insulating layer interposed, a control gate 3 formed thereabove with an insulating layer interposed, and a source 4 and a drain 5 formed on the well W surface on the opposite sides of gates 2, 3, respectively. Prescribed voltages VW, VG, VS, VD are applied to well W, control gate 3, source 4, and drain 5, respectively. Threshold voltage VT of memory transistor 1 varies depending on the number of electrons in floating gate 2.

In a reading operation, as shown in FIG. 2A, 1V is applied to drain 5 of memory transistor 1, 3.3V is applied to control gate 3, and 0V is applied to source 4 and well W, so that it is determined whether a current ID between drain 5 and source 4 exceeds a prescribed current IT, as shown in FIG. 2B. If data "0" is written in memory transistor 1, ID<IT, and if not, ID>IT.

In a writing operation, as shown in FIG. 3A, 5V and 9V are applied to drain 5 and control gate 3 of memory transistor 1, respectively, and 0V is applied to source 4 and well W. As a result, because of the tunnel effect, electrons are injected from source 4 and well W to floating gate 2, so that a threshold voltage VT of memory transistor 1 is increased. As shown in FIG. 3B, the VG–ID characteristic of memory transistor 1 changes from curve A to curve B. In other words, the storage data in memory transistor 1 is rewritten from "1" to "0". Data write is performed at a plurality of different times in order to prevent variations in threshold voltage of memory transistor 1.

In an erasing operation, as shown in FIG. 4A, source 4 and drain 5 of memory transistor 1 are opened (in the floating state), −10V is applied to control gate 3, and a voltage of 7.5V or higher is applied to well W. Therefore, because of the tunnel effect, electrons are removed from floating gate 2 to well W, so that threshold voltage VT of memory transistor 1 is decreased. As shown in FIG. 4B, the VG–ID characteristic of memory transistor 1 changes from curve B to curve A. In other words, the storage data in memory transistor 1 is rewritten from "0" to "1". The data erasing is performed at a plurality of different times in order to eliminate variations in threshold voltage of memory transistor 1. The erasing method will be described later in detail.

Figure 5:
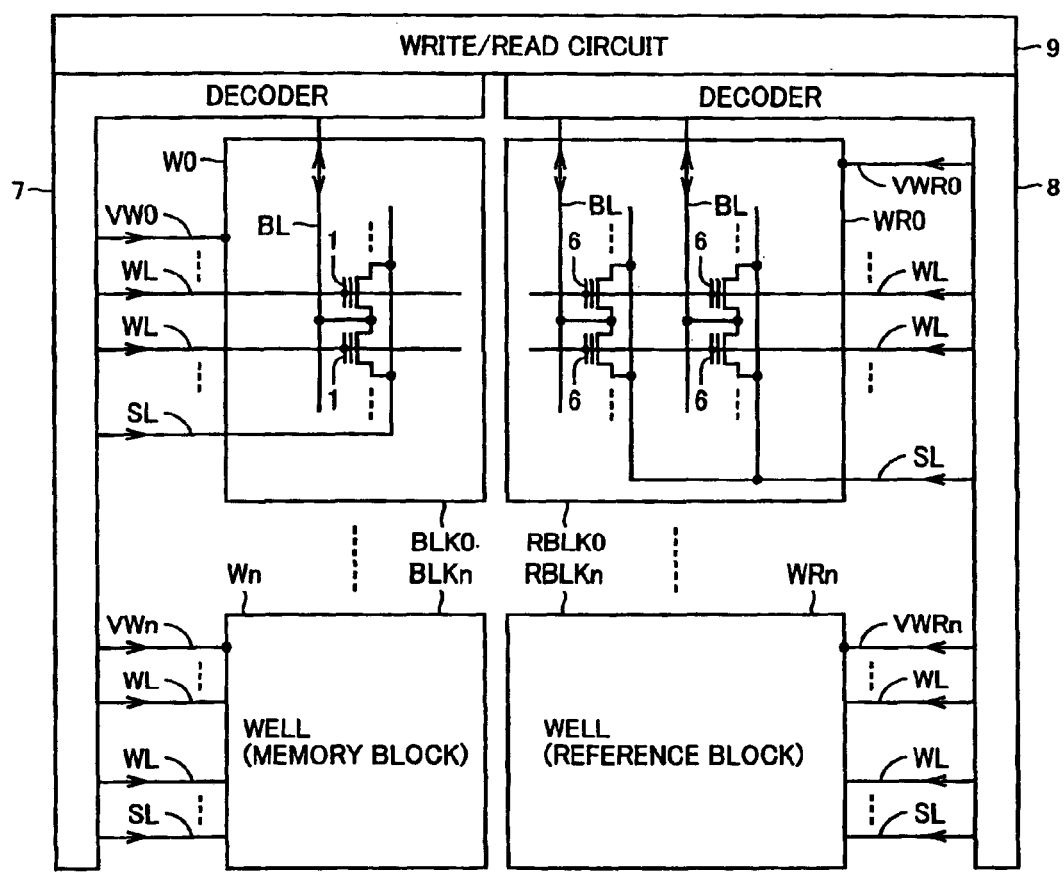
FIG. 5 is a circuit diagram showing the entire configuration of the flash memory including the memory transistor shown in FIG. 1.

FIG. 5 is a circuit block diagram showing the main part of the flash memory including memory transistor 1 shown in FIGS. 1–4. In FIG. 5, this flash memory is formed on a surface of a semiconductor substrate. Here, 2n+2 wells W0–Wn, WR0–WRn (where n is an integer equal to or greater than 0) are formed on the surface of the semiconductor substrate. Memory blocks BLK0–BLKn are formed on the surfaces of wells W0–Wn, respectively, and reference blocks RBLK0–RBLKn are formed on the surfaces of well WR0–WRn, respectively. Reference blocks RBLK0–RBLKn are provided corresponding to memory blocks BLK0–BLKn, respectively. Memory blocks BLK0–BLKn and reference blocks RBLK0–RBLKn constitute one memory array.

Memory block BLK0 includes a plurality of memory transistors 1 arranged in a plurality of columns and rows, a plurality of word lines WL provided respectively corresponding to a plurality of rows, a plurality of bit lines BL provided respectively corresponding to a plurality of columns, and a source line SL. A plurality of memory transistors 1 in each column are connected in series. Each memory transistor 1 has the control gate connected to a corresponding word line WL, the drain connected to a corresponding bit line BL, and the source connected to source line SL. The other memory blocks BLK1–BLKn have the same configuration as memory block BLK0. Reference blocks RBLK0–RBLKn have the same configuration as memory block BLK0 except that they have fewer memory transistors 1. It is noted that memory transistors 1 in reference blocks RBLK0–RBLKn are used as reference transistors 6.

A decoder 7 is provided corresponding to memory blocks BLK0–BLKn, a decoder 8 is provided corresponding to reference blocks RBLK0–RBLKn, and a write/read circuit 9 is provided in common to memory blocks BLKL0–BLKn and reference blocks RBLK0–RBLKn. Decoder 7 selects any one of n+1 memory blocks BLK0–BLKn and any one of a plurality of memory transistors 1 belonging to that memory block, in accordance with an address signal. The gate voltage VG, drain voltage VD, source voltage VS, well voltage VW of the selected memory transistor 1 are controlled by decoder 7 and write/read circuit 9, and data "0" or "1" is written into memory transistor 1.

Decoder 8 selects any one of n+1 reference blocks RBLK0–RBLKn and any one of a plurality of reference transistors 6 belonging to that reference block, in accordance with an address signal. The gate voltage VG, drain voltage VD, source voltage VS, well voltage VW of the selected reference transistor 6 are controlled by decoder 8 and write/read circuit 9, and the threshold voltage of reference transistor 6 is set at a predetermined value depending on a chip, block RBLK, and an address in block RBLK.

Figure 6:
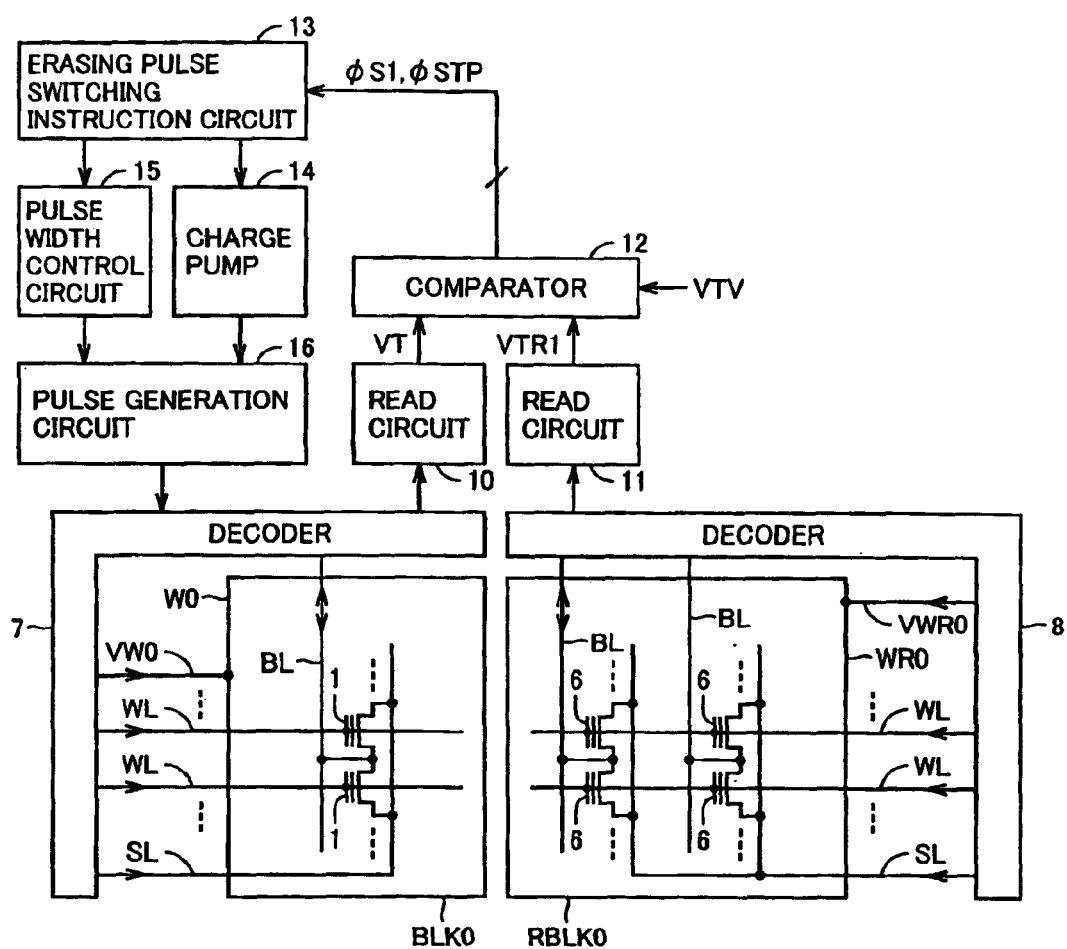
FIG. 6 is a circuit block diagram showing a part in connection with data erasing in a write/read circuit shown in FIG. 5.

FIG. 6 is a circuit block diagram showing a part of write/read circuit 9 in FIG. 5 which is in connection with data erasing. In FIG. 6, write/read circuit 9 includes read circuits 10, 11, a comparator 12, an erasing pulse switching instruction circuit 13, a charge pump 14, a pulse width control circuit 15, and a pulse generation circuit 16. Read circuit 10 detects threshold voltage VT of the memory transistor 1 selected by decoder 7. Read circuit 11 detects threshold voltage VTR1 of the reference transistor 6 selected by decoder 8. This threshold voltage VTR1 is set at an approximately intermediate voltage (for example 5.0V) between the threshold voltage (7.5V or higher) of memory transistor 1 having data "0" written and the threshold voltage (2.7V or lower) of memory transistor 1 having data "1" written. Threshold voltage VTR1 is set such that variations in erasing time between chips, blocks BLK, and addresses in blocks BLK are reduced.

Comparator 12 compares threshold voltage VT of memory transistor 1 detected by read circuit 10 with threshold voltage VTR1 of reference transistor 6 detected by read circuit 11, sets a signal φS1 (a pulse waveform instruction signal) to "H (high)" level if VT≧VTR1, and sets signal φS1 to "L (low)" level if VT<VTR1. Comparator 12 also compares threshold voltage VT of memory transistor 1 detected by read circuit 10 with a verify voltage VTV (2.7V), sets a signal φSTP to "H" level if VT>VTV, and sets signal φSTP to "L" level if VT≦VTV.

Erasing pulse switching instruction circuit 13 controls charge pump 14 and pulse width control circuit 15 in accordance with output signals φS1, STP of comparator 12. The erasing operation is performed for each memory block BLK. In the erasing operation, all the word lines WL in memory block BLK as the erasing target are fixed at −10V, and a pulse signal train is applied to well W. Charge pump 14 generates a voltage of a pulse signal. The voltage of the pulse signal is raised by a step voltage ΔV=0.1V, starting from 7.5V, for each pulse signal. The voltage of the pulse signal is gradually raised, because if the voltage is kept constant, an electric field E of the insulating layer between floating gate 2 and well W is reduced with the progress of erasing.

Pulse width control circuit 15 controls the pulse width of the pulse signal. The pulse width is set at 0.5 msec in the first half period during which threshold voltage VT of memory transistor 1 is equal to or higher than threshold voltage VTR1 of reference transistor 6, while it is set at 6.0 msec in the latter half period during which reference voltage VT of memory transistor 1 is lower than threshold voltage VTR1 of reference transistor 6. Since the interval of the pulse signal is kept constant at 0.1 msec, the voltage of the pulse signal rises by 3.7 V per 10 msec during the first half period whereas the voltage of the pulse signal rises by 0.1 V per 10 msec during the latter half period. In simulation, during the latter half period, the electric field between floating gate 2 and well W is weakened as electrons are removed from floating gate 2 to well W.

Therefore, during the first half period, threshold voltage VT of memory transistor 1 can be decreased rapidly, thereby reducing the erasing time. On the other hand, during the latter half period, threshold voltage VT of memory transistor 1 can be decreased slowly, thereby preventing depletion of memory transistor 1. Pulse generation circuit 16 generates a pulse signal train based on the output voltage of charge pump 14 and the output signal of pulse width control circuit 15, and supplies the generated pulse signal train to well W corresponding to memory block BLK selected by decoder 7. Erasing pulse switching instruction circuit 13, charge pump 14, pulse width control circuit 15, pulse generation circuit 16, and decoder 7 constitute a data signal rewriting circuit.

Figure 7:
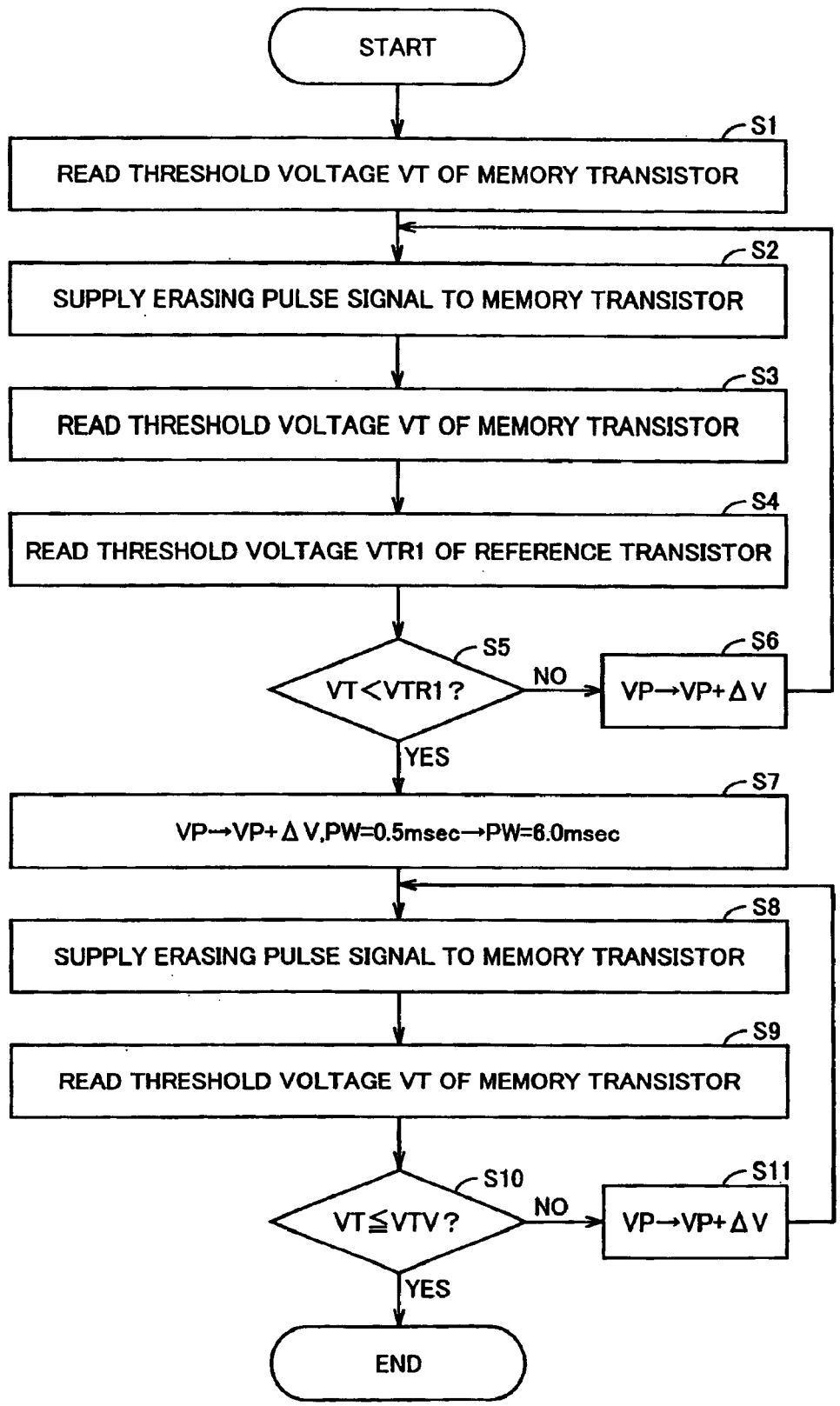
FIG. 7 is a flow chart showing an erasing operation of the flash memory shown in FIGS. 1–6.
Figure 8:
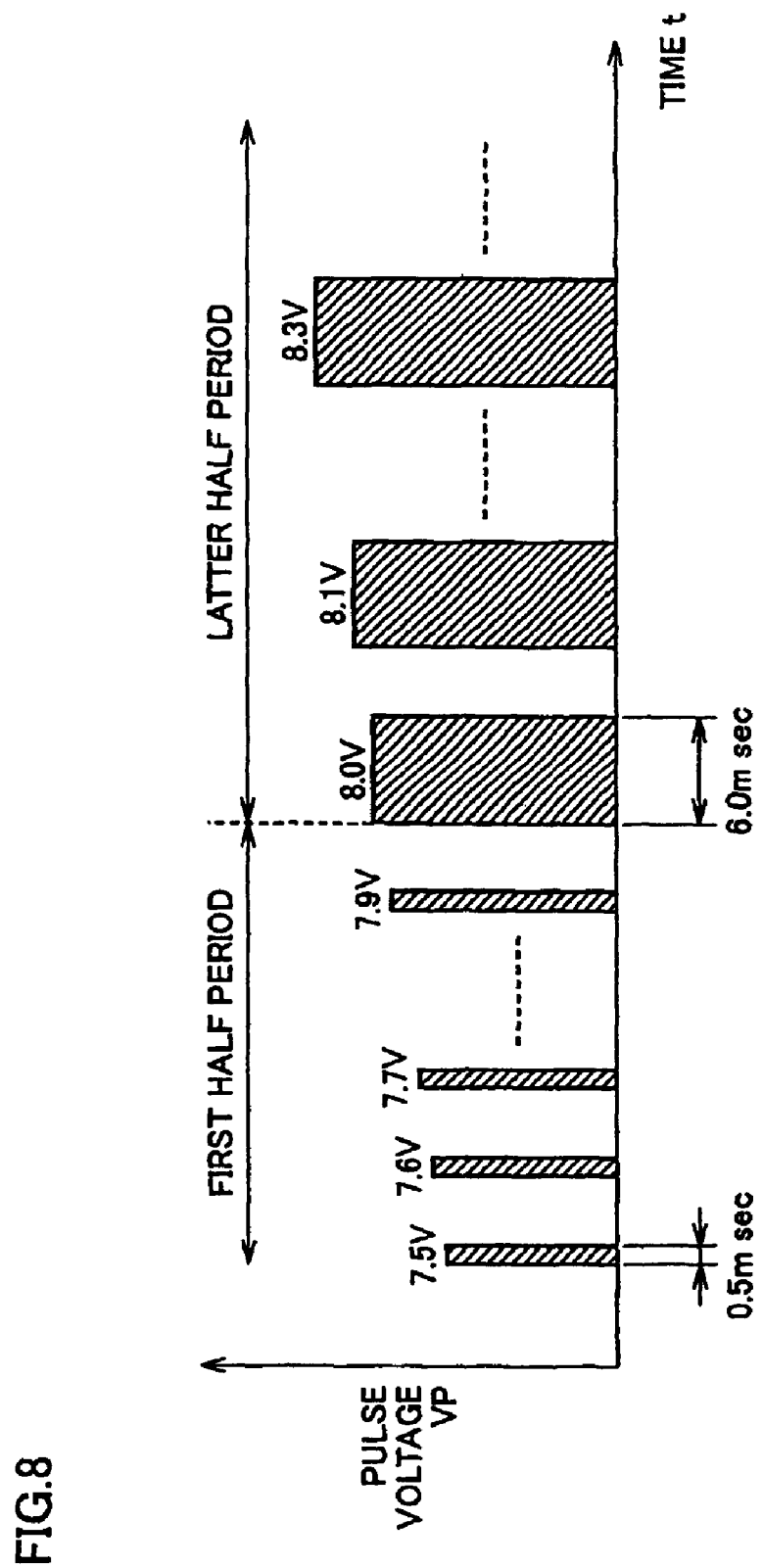
FIG. 8 is a waveform diagram showing an erasing pulse signal shown in FIG. 7.

FIG. 7 is a flow chart showing the erasing operation of this flash memory, and FIG. 8 is a waveform diagram of the erasing pulse signal train. Referring to FIGS. 7 and 8, at step S1, threshold voltage VT of memory transistor 1 is read, and at step S2, the erasing pulse signal is supplied to well W of memory transistor 1. The pulse voltage VP of the initial pulse signal is set at 7.5V, and the pulse width of the erasing pulse signal is set at 0.5 msec. The interval between two erasing pulse signals is fixed at 0.1 msec throughout the periods. Control gate 3 of memory transistor 1 is set at −10V, and source 4 and drain 5 are opened.

At step S3, threshold voltage VT of memory transistor 1 is read by read circuit 10, and at step S4, threshold voltage VTR1 of reference transistor 6 is read by read circuit 11. At step S5, VT and VTR1 are compared with each other by comparator 12. If VT≧VTR1, at step S6, pulse voltage VP is increased by step voltage ΔV=0.1V, and thereafter returning to step S2 again, the erasing pulse signal is supplied to memory transistor 1. At this point, the pulse voltage VP of the erasing pulse signal is set at VP=7.5+0.1=7.6V. Steps S2–S6 are repeatedly performed until VT<VTR1.

When VT<VTR1, at step S7, pulse voltage VP is increased by step voltage ΔV=0.1V, and in addition, pulse width PW is switched from 0.5 msec to 6.0 msec. At step S8, the erasing pulse signal is supplied to memory transistor 1. Assuming that pulse voltage VP of the last erasing pulse signal in the first half period was 7.9 V, pulse voltage VP of the initial erasing pulse signal in the latter half period is 8.0 V.

At step S9, threshold voltage VT of memory transistor 1 is read by read circuit 10, and at step S10, VT is compared with verify voltage VTV by comparator 12. If VT>VTV, at step S11, pulse voltage VP is increased by step voltage ΔV=0.1V, and thereafter returning to step S8 again, the erasing pulse signal is supplied to memory transistor 1. At this point, pulse voltage VP of the erasing pulse signal is set at VP=8.0+0.1=8.1 V. Steps S7–S11 are repeatedly performed until VT≦VTV. When VT≦VTV, the erasing operation ends.

FIGS. 9A–9D illustrate threshold voltage VT distributions of a plurality of memory transistors 1 belonging to memory block BLK as the erasing target. The axis of abscissa shows threshold voltage VT of memory transistor 1 and the axis of ordinate shows the number N of memory transistors 1. Before the start of the erasing operation, data "0" is written into all memory transistors 1, and threshold voltage VT of memory transistor 1 is set at 7.5 V or higher, as shown in FIG. 9A. By performing steps S1–S6 in FIG. 7, threshold voltage VT of memory transistor 1 is decreased, as shown in FIG. 9B.

Figure 9:
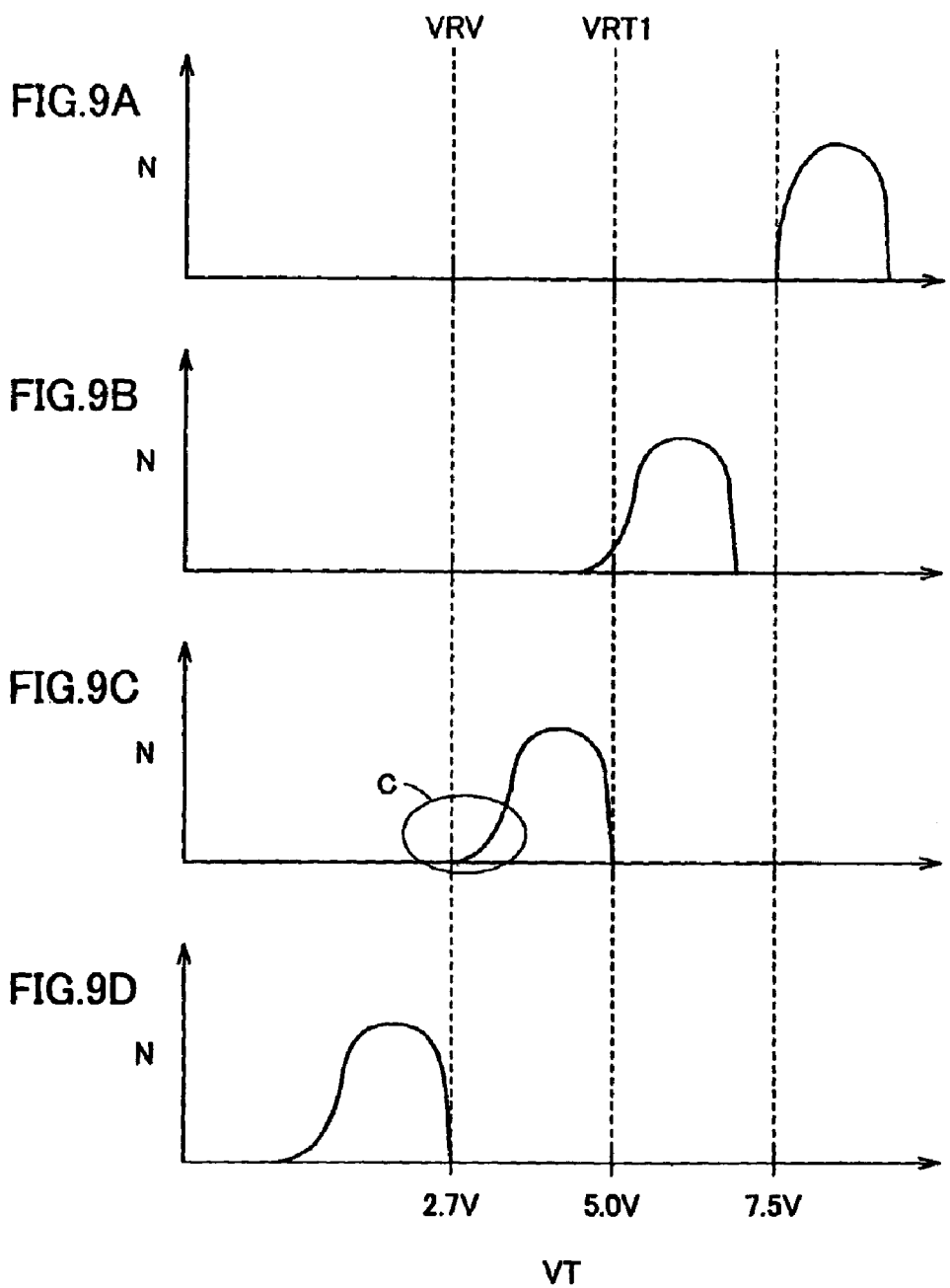
FIGS. 9A–9D illustrate a change in threshold distribution with time during an erasing period.

The rising speed of the pulse voltage of the erasing pulse signal is reduced in response to threshold voltage VT of memory transistor 1 becoming lower than threshold voltage VTR1=5.0V of reference transistor 6. This prevents the excessive decrease of the threshold voltage of memory transistor 1 of which threshold voltage VT changes relatively quickly as shown in C in FIG. 9. As shown in FIG. 9D, the erasing operation is ended in response to threshold voltage VT of memory transistor 1 attaining verify voltage VTV=2.7V or lower.

In the first embodiment, threshold voltage VT of memory transistor 1 is decreased quickly by increasing the rising speed of the pulse voltage of the erasing pulse signal during the first half period in the erasing operation and threshold voltage VT of memory transistor 1 is decreased slowly by reducing the rising speed of the pulse voltage of the erasing pulse signal during the latter half period in the erasing operation, thereby reducing the erasing time and preventing depletion of memory transistor 1.

Furthermore, memory transistor 1 and reference transistor 6 have the same structure and have the same characteristics, so that the effect of the characteristic variations of memory transistor 1 and reference transistor 6 is cancelled out and variations in erasing time are reduced.

In addition, by changing threshold voltage VTR1 of reference transistor 6, the timing at which the pulse width of the erasing pulse signal can be changed, and the erasing time can be adjusted. It is possible to prevent variations in erasing time among a plurality of chips and variations in erasing time in memory blocks BLK0–BLKn. Even if the erasing time varies depending on the number of rewritings, the variation of the erasing time can be prevented by selecting different reference transistors 6.

In addition, since memory blocks BLK0–BLKn and reference blocks RBLK0–RBLKn are provided in one memory array, a smaller area is required as compared with when memory blocks BLK0–BLKn and reference blocks RBLK0–RBLKn are provided in respective memory arrays. This is because provision of memory blocks BLK0–BLKn and reference blocks RBLK0–RBLKn in one memory array requires only one dummy transistor region, which has to be provided at the periphery portion of the memory array in order to stabilize the shape of the memory array, whereas provision of memory blocks BLK0–BLKn and reference blocks RBLK0–RBLKn in different memory arrays requires two dummy transistor regions.

Furthermore, since memory blocks BLK0–BLKn and reference blocks RBLK0–RBLKn are provided in one memory array, memory transistor 1 can be arranged in the vicinity of reference transistor 6. Therefore, the characteristics variations can be at the same level between memory transistor 1 and reference transistor 6, which is effective in light of production management.

It is noted that although in the first embodiment, data erasing is performed by applying −10V to control gate 3 of memory transistor 1, applying a positive pulse to well W, and rendering source 4 and drain 5 opened, the data erasing may be performed under different conditions. For example, +10V may be applied to well W and a negative pulse may be applied to control gate 3.

Although the reading of threshold voltage VT of memory transistor 1 (step S3) and the reading of threshold voltage VTR1 of reference transistor 6 (step S4) have been performed at different steps, VT and VTR1 may be read in parallel at the same step. In this case, the erasing time can be shorter by the time corresponding to one step.

Although threshold voltage VT of memory transistor 1 read by read circuit 10 has been compared by comparator 12 with threshold voltage VTR1 of reference transistor 6 read by read circuit 11, the same voltage is applied to control gates 3 of memory transistor 1 and of reference transistor 6, and the current flowing in memory transistor 1 detected by read circuit 10 may be compared by comparator 12 with the current flowing in reference transistor 6 detected by read circuit 11.

Although threshold voltage VTR1 of one reference transistor 6 has been used as a switching point of the erasing condition, the mean value of threshold voltages VTR1 of a plurality of reference transistors 6 may be used as the switching point of the erasing condition, after threshold voltage VTR1 of the same value is written in a plurality of reference transistors 6 belonging to one group. A plurality of reference transistors 6 connected to one bit line BL may form a group. Alternatively, a plurality of reference transistors 6 connected to one word line WL may form a group. Furthermore, the current flowing in memory transistor 1 may be compared with the mean value of currents flowing in a plurality of reference transistors 6. In this case, even if a malfunction occurs in one reference transistor 6, the error in erasing control can be limited to a lesser degree.

[Second Embodiment]

Figure 10:
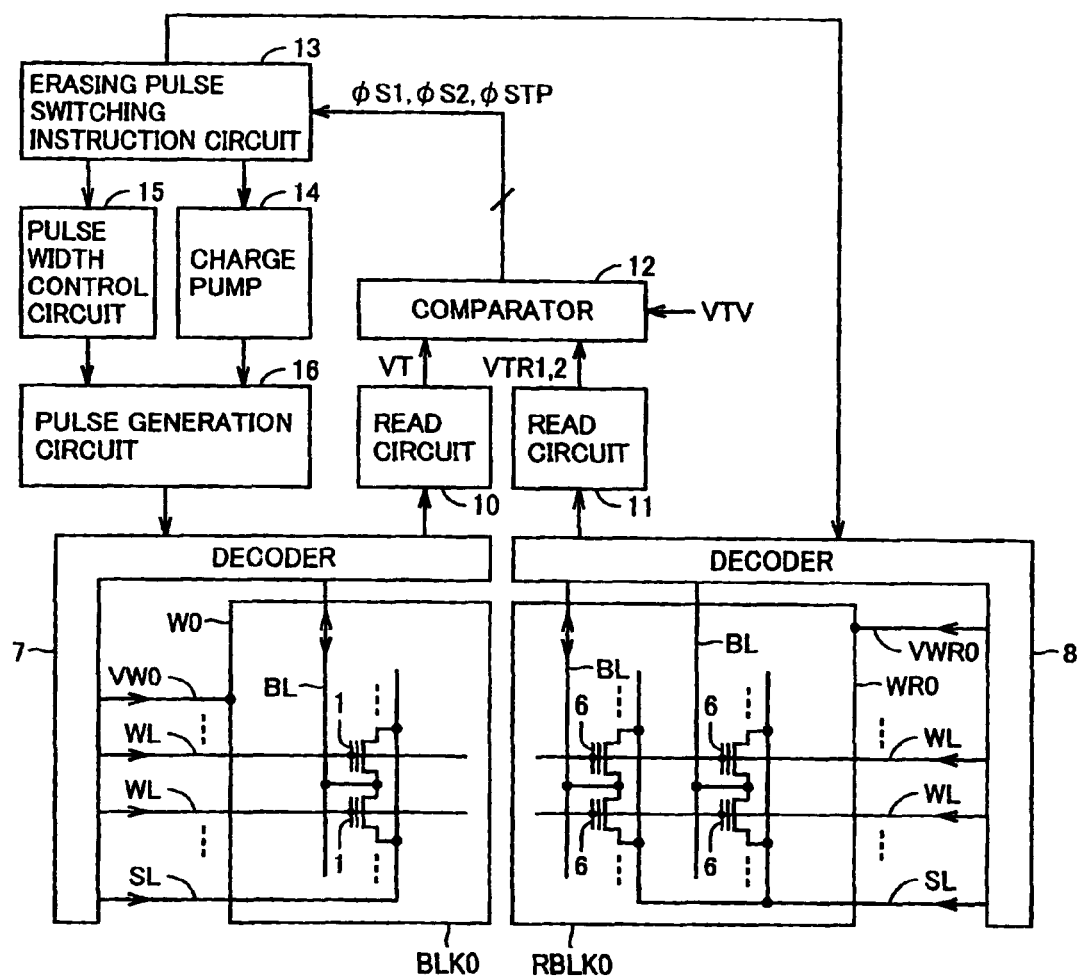
FIG. 10 is a circuit block diagram showing a main part of a flash memory in accordance with a second embodiment of the present invention.

FIG. 10 is a circuit block diagram showing a part in connection with data erasing in a flash memory in accordance with a second embodiment of the present invention, in contrast with FIG. 6. Referring to FIG. 10, read circuit 10 detects threshold voltage VT of memory transistor 1 selected by decoder 7. Read circuit 11 detects threshold voltages VTR1, VTR2 of two reference transistors 6 selected by decoder 8. Threshold voltage VTR1 is set at a voltage (for example 5.0V) between the threshold voltage (7.5V) of memory transistor having data "0" written and the threshold voltage (2.7V) of memory transistor 1 having data "1" written. Threshold voltage VTR2 is set at a voltage (2.8V–3.2V, for example 3.0V) slightly higher than the threshold voltage (2.7V) of memory transistor 1 having data "1" written.

Comparator 12 compares threshold voltage VT of memory transistor 1 detected by read circuit 10 with threshold voltage VTR1 of reference transistor 6 detected by read circuit 11, sets signal φS1 to "H" level if VT≧VTR1, and sets signal φS1 to "L" level if VT<VTR1. Comparator 12 also compares threshold voltage VT of memory transistor 1 detected by read circuit 10 with threshold voltage VTR2 of reference transistor 6 detected by read circuit 11, sets signal φS2 to "H" level if VT≧VTR2, and sets signal φS2 to "L" level if VT<VTR2. Comparator 12 also compares threshold voltage VT of memory transistor 1 detected by read circuit 10 with verify voltage VTV, sets signal φSTP to "H" level if VT>VTV, and sets signal φSTP to "L" level if VT≦VTV.

Erasing pulse switching instruction circuit 13 controls decoder 8, charge pump 14, and pulse width control circuit 15 in accordance with the output signals φS1, φS2, φSTP of comparator 12. Pulse width control circuit 15 controls the pulse width of the pulse signal. The pulse width is set at 0.5 msec in the first half period during which VTR1≦VT, is set at 6.0 msec in the latter half period during which VTR2≦VT<VTR1, and is set at 3.0 msec in the last period during which VTV≦VT<VTR2. As the interval of the pulse signal is kept constant at 0.1 msec, the voltage of the pulse singal rises by 3.7V per 10 msec in the first half period, by 0.1V per 10 msec in the latter half period, and by 0.3V per 10 msec in the last period. The voltage rising speed in the last period is greater than the voltage rising speed in the latter half period, because a lot of electrons are removed from floating gate 2 at the end of the latter half period, and therefore a high voltage need to be applied between control gate 3 and well W in order to intensify the electric field between floating gate 2 and well W.

Therefore, in the first half period, threshold voltage VT of memory transistor 1 can be decreased rapidly, thereby reducing the erasing time. On the other hand, in the latter half period, threshold voltage VT of memory transistor 1 can be decreased slowly, thereby preventing depletion of memory transistor 1. Furthermore, in the last period, threshold voltage VT of memory transistor 1 of which threshold voltage VT changes relatively slowly can be decreased quickly, thereby further reducing the erasing time. In simulation, while the erasing time was 23 msec in the first embodiment, the erasing time was 22 msec in the second embodiment. Charge pump 14 and pulse generation circuit 16 are similar to those in the first embodiment.

Figure 11:
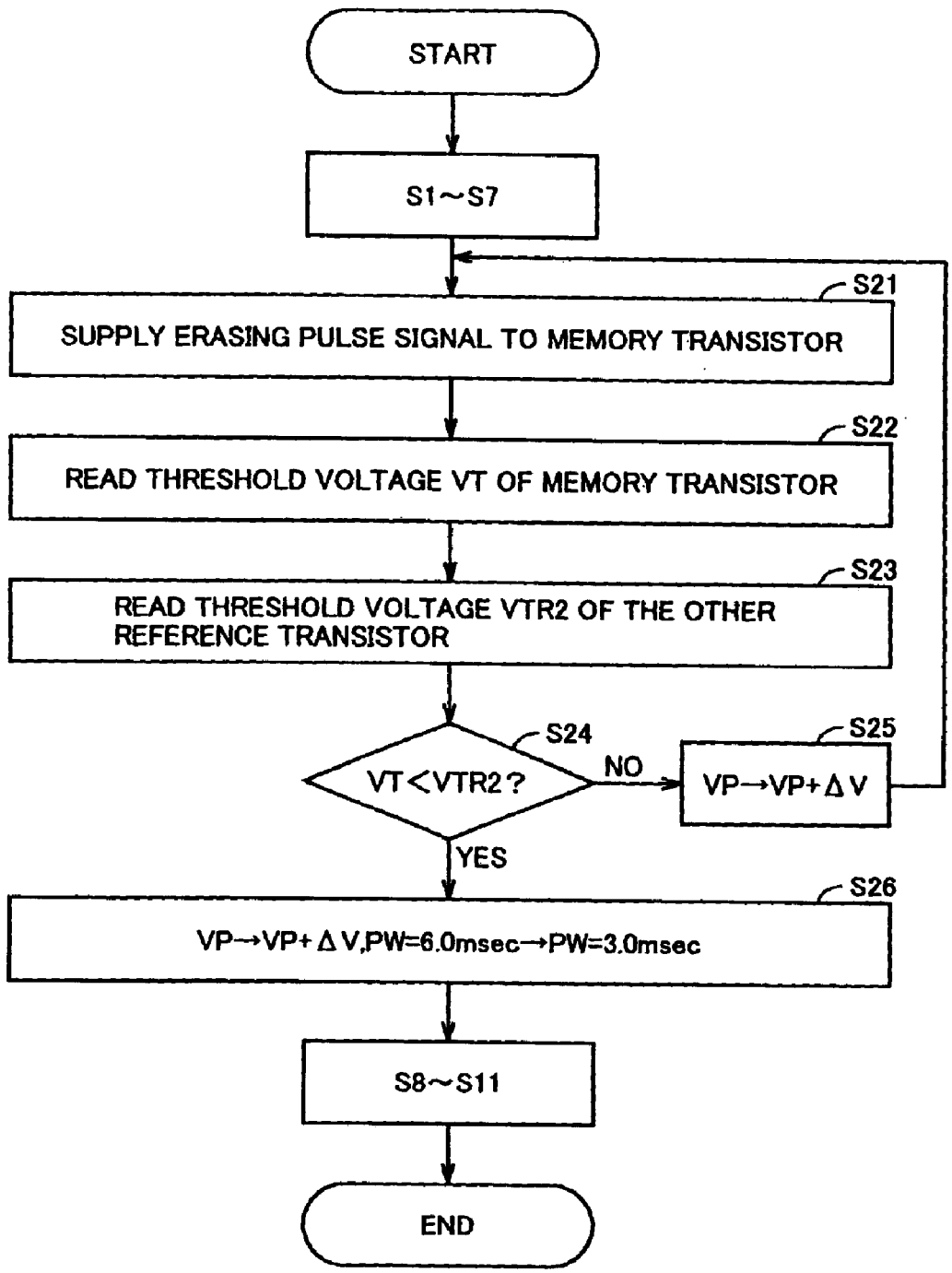
FIG. 11 is a flow chart showing an erasing operation of the flash memory shown in FIG. 10.
Figure 12:
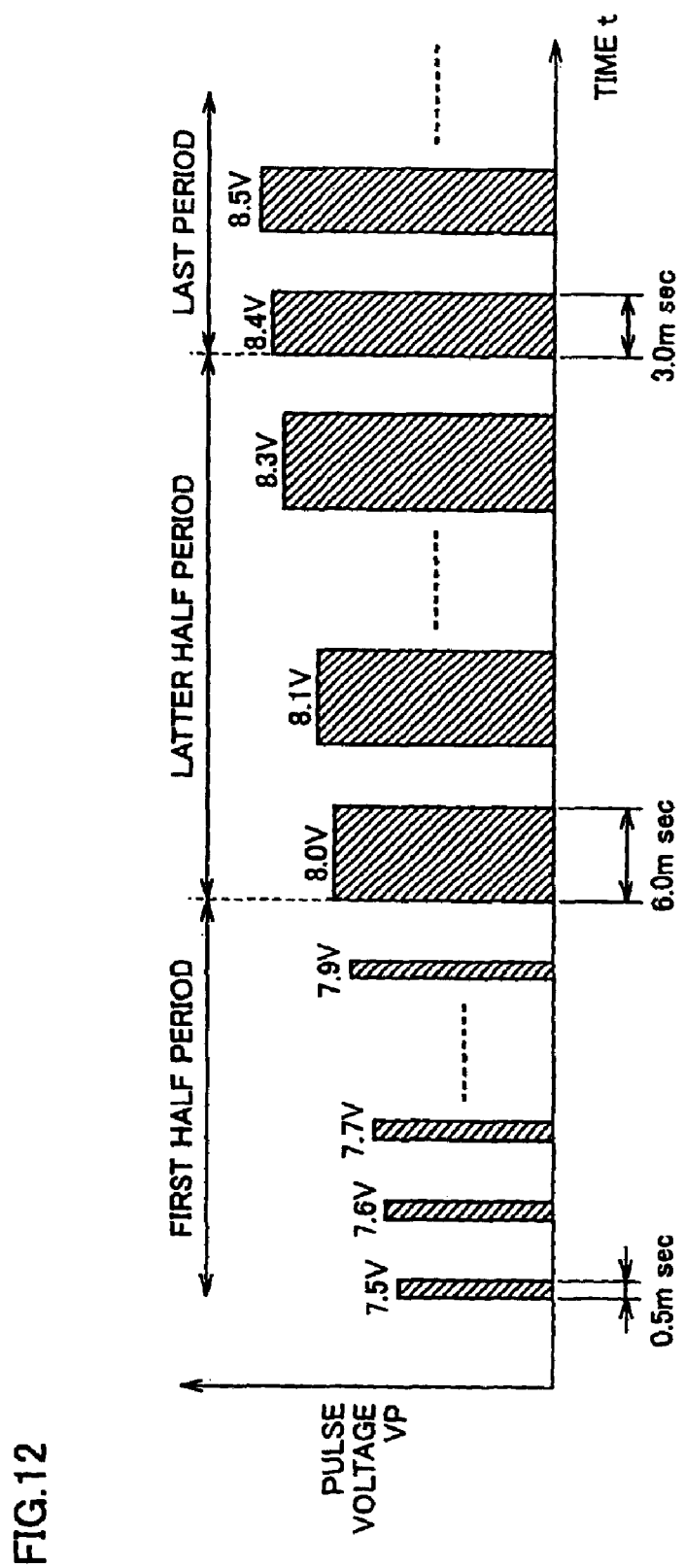
FIG. 12 is a waveform diagram showing an erasing pulse signal shown in FIG. 11.
Figure 13:
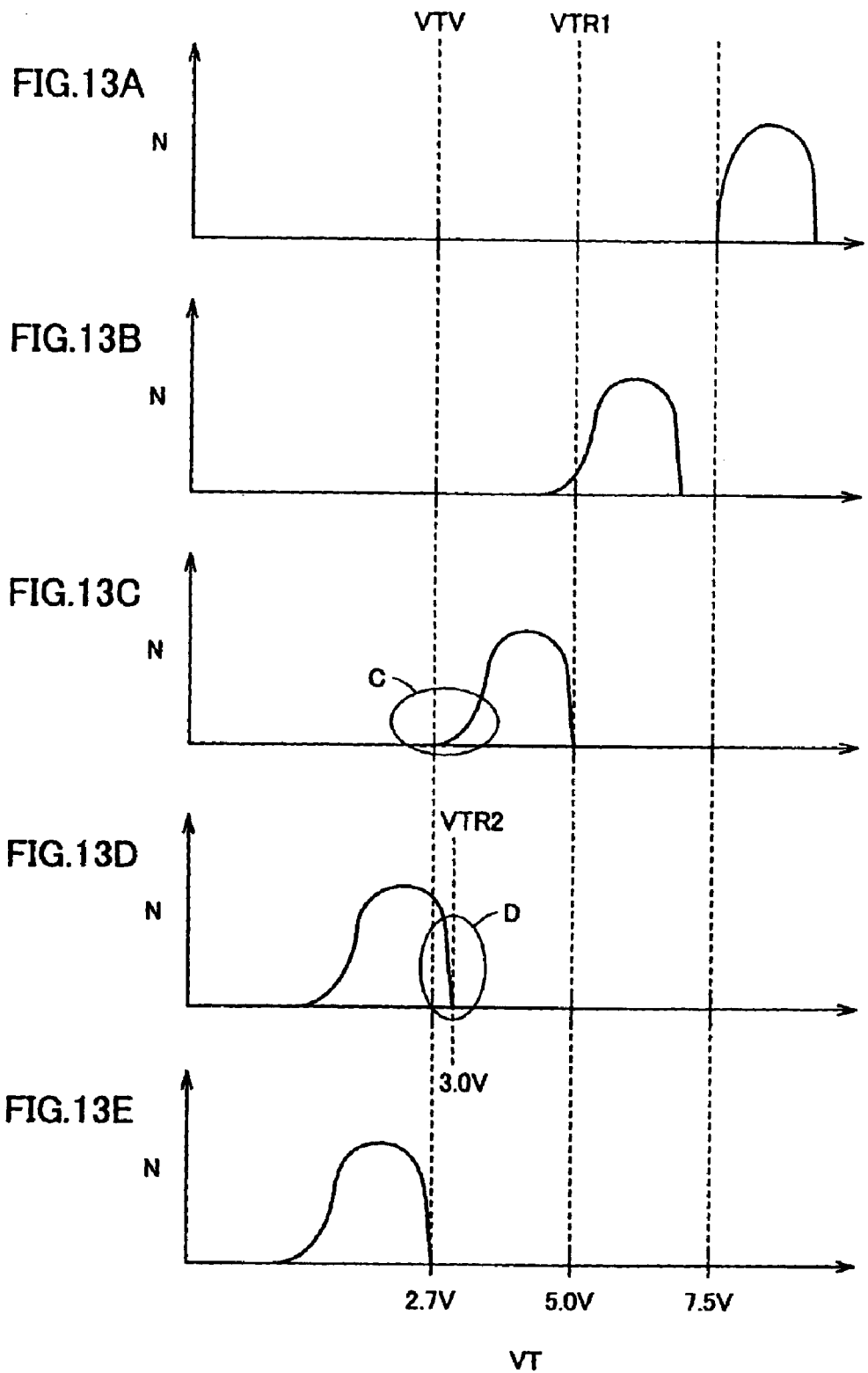
FIGS. 13A–13E illustrate a change in threshold distribution with time during an erasing period.

FIG. 11 is a flow chart illustrating the erasing operation of the flash memory shown in FIG. 10. FIG. 12 is a waveform diagram of an erasing pulse signal train. Referring to FIGS. 11 and 12, in this flash memory, steps S21–S26 are performed between steps S7 and S8 in the first embodiment. At step S 21 following step S7, the erasing pulse signal is supplied to well W of memory transistor 1. The pulse width of this erasing pulse signal is set at 6.0 msec. Assuming that the pulse voltage VP of the last erasing pulse signal in the first half period was 7.9V, the pulse voltage VP of the first erasing pulse signal in the latter half period is 8.0V.

Then, at step S22, threshold voltage VT of memory transistor 1 is read by read circuit 10, and at step S23, threshold voltage VTR2 of the other reference transistor 6 is read by read circuit 11. At step S24, VT is compared with VTR2 by comparator 12. If VT≧VTR2, at step S25, pulse voltage VP is increased by step voltage ΔV=0.1V, and thereafter returning to step S21 again, the erasing pulse signal is supplied to memory transistor 1. Here, pulse voltage VP of the erasing pulse signal is set at VP=8.0+0.1=8.1 V. Steps S21–25 are repeatedly performed until VT<VTR2.

When VT<VTR2, at step S26, pulse voltage VP is increased by step voltage ΔV=0.1V, and in addition, pulse width PW is switched from 6.0 msec to 3.0 msec. At step S8, the erasing pulse signal is supplied to memory transistor 1. Assuming that pulse voltage VP of the last erasing pulse signal in the latter half period was 8.3V, pulse voltage VP of the initial pulse signal in the last period is 8.4V.

At step S9, threshold voltage VT of memory transistor 1 is read by read circuit 10, and at step S10, VT is compared with verify voltage VTV by comparator 12. If VT>VTV, at step S1, pulse voltage VP is increased by step voltage ΔV=0.1V, and thereafter returning to step S8 again, the erasing pulse signal is supplied to memory transistor 1. Here, pulse voltage VP of the erasing pulse signal is set at VP=8.4+0.1=8.5V. Steps S8–S11 are repeatedly performed until VT≦VTV. When VT≦VTV, the erasing operation ends.

FIGS. 13A–13E illustrate threshold voltage VT distributions of a plurality of memory transistors belonging to memory block BLK as the erasing target. In each of FIGS. 13A–13E, the axis of abscissa shows threshold voltage VT of memory transistor 1, and the axis of ordinate shows the number N of memory transistors 1. Data "0" is written in all memory transistors 1 before the start of the erasing operation, and as show in FIG. 13A, threshold voltage VT of memory transistor 1 is set at 7.5V or higher. By performing steps S1–S7 in FIG. 11, threshold voltage VT of memory transistor 1 is decreased, as shown in FIG. 11B.

Pulse width PW of the erasing pulse signal is increased from 0.5 msec to 6.0 msec in response to threshold voltage VT of memory transistor 1 becoming lower than threshold voltage VTR1=5.0V of reference transistor 6. This prevents the excessive decrease of the threshold voltage of memory transistor 1 of which threshold voltage VT changes relatively quickly as shown in C in FIG. 13C.

Pulse width PW of the erasing pulse signal is reduced from 6.0 msec to 3.0 msec in response to threshold voltage VT of memory transistor 1 becoming lower than threshold voltage VTR2=3.0V of the other reference transistor 6. This quickly decreases threshold voltage VT of memory transistor 1 of which threshold voltage VT changes relatively slowly as shown in D in FIG. 13D.

In the second embodiment, threshold voltage VT of memory transistor 1 is decreased quickly by increasing the rising speed of the pulse voltage of the erasing pulse signal in the first half period of the erasing operation, threshold voltage VT of memory transistor 1 is decreased slowly by reducing the rising speed of the pulse voltage of the erasing pulse signal in the latter half period of the erasing operation, and threshold voltage VT of memory transistor 1 of which threshold voltage VT hardly changes is decreased quickly by increasing again the rising speed of the pulse voltage of the erasing pulse signal in the last period of the erasing operation. Therefore, the erasing time can be reduced and depletion of memory transistor 1 can be prevented.

It is noted that although in the second embodiment, two reference voltages VTR1, VTR2 are provided, three or more reference voltages may be provided.

[Third Embodiment]

Figure 14:
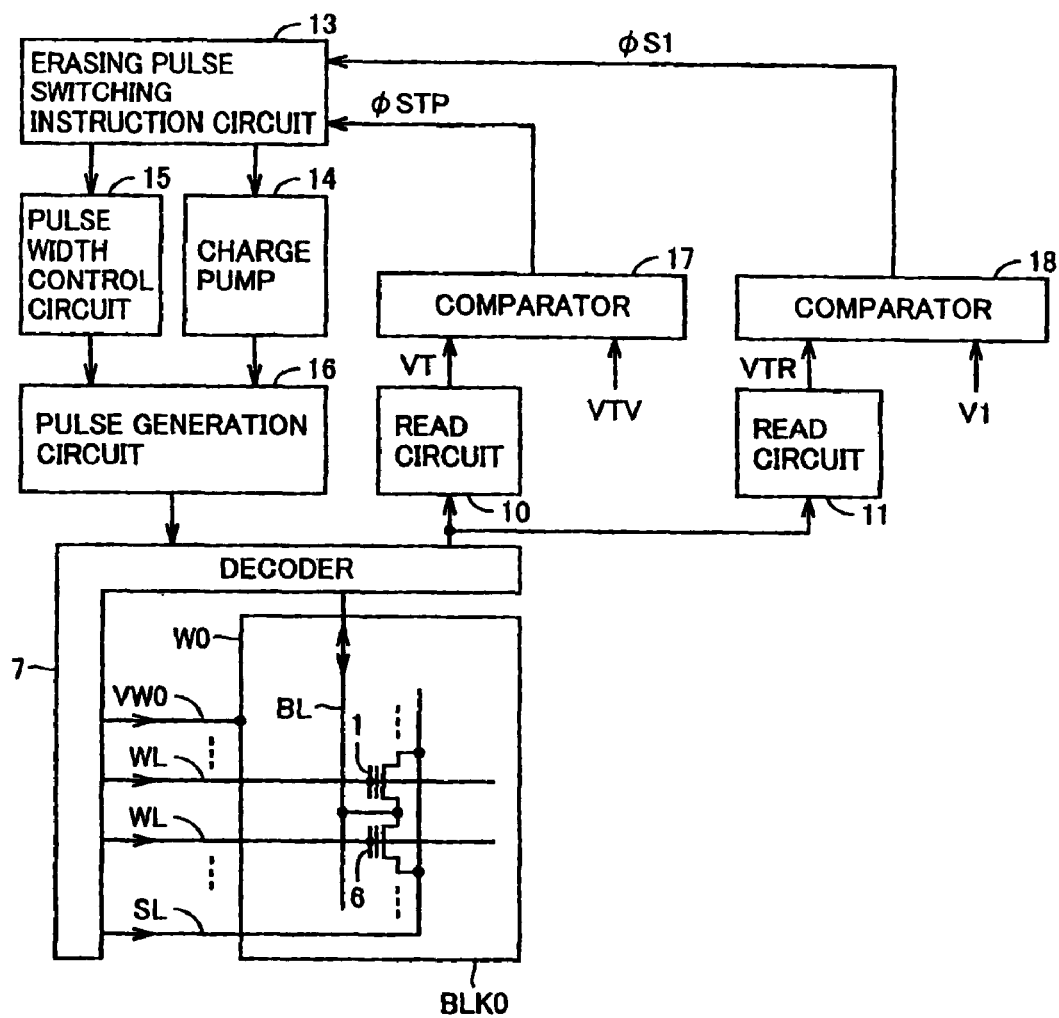
FIG. 14 is a circuit block diagram showing a main part of a flash memory in accordance with a third embodiment of the present invention.

FIG. 14 is a block diagram showing a main part of a flash memory in accordance with a third embodiment of the present invention, in contrast with FIG. 6. Referring to FIG. 14, the present flash memory differs from the flash memory in FIG. 6 in that reference block RBLK is omitted, two read circuits 10, 11 are connected together to memory block BLK through decoder 7, and comparator 12 is replaced with two comparators 17 and 18.

In this flash memory, one memory transistor 1 preliminarily selected from a plurality of memory transistors 1 belonging to memory block BLK is uses as reference transistor 6. In the erasing operation, threshold voltage VTR of reference transistor 6 is decreased together with threshold voltage VT of all the memory transistors 1 in memory block BLK as the erasing target.

Read circuit 10 detects threshold voltage VT of memory transistor 1 selected by decoder 7. Read circuit 11 detects threshold voltage VTR of reference transistor 6 selected by decoder 7. Comparator 18 compares threshold voltage VTR of reference transistor 6 detected by read circuit 11 with reference voltage V1, sets signal φS1 to "H" level if VTR≧V1, and sets signal φS1 to "L" level if VTR<V1. Threshold voltage VTR of reference transistor 6 probably corresponds to the center of the threshold distribution of memory block BLK. Therefore, if the upper limit value of the threshold distribution is shifted from the center by 0.5V, reference voltage V1 is set to 4.5V, which is 0.5V lower than reference voltage VTR1 shown in FIG. 9.

Comparator 17 compares threshold voltage VT of memory transistor 1 detected by read circuit 10 with verify voltage VTV, sets signal φSTP to "H" level if VT>VTV, and sets signal φSTP to "L" level if VT≦VTV. Erasing pulse switching instruction circuit 13, charge pump 14, pulse width control circuit 15, and pulse generation circuit 16 are similar to those shown in FIG. 6.

Figure 15:
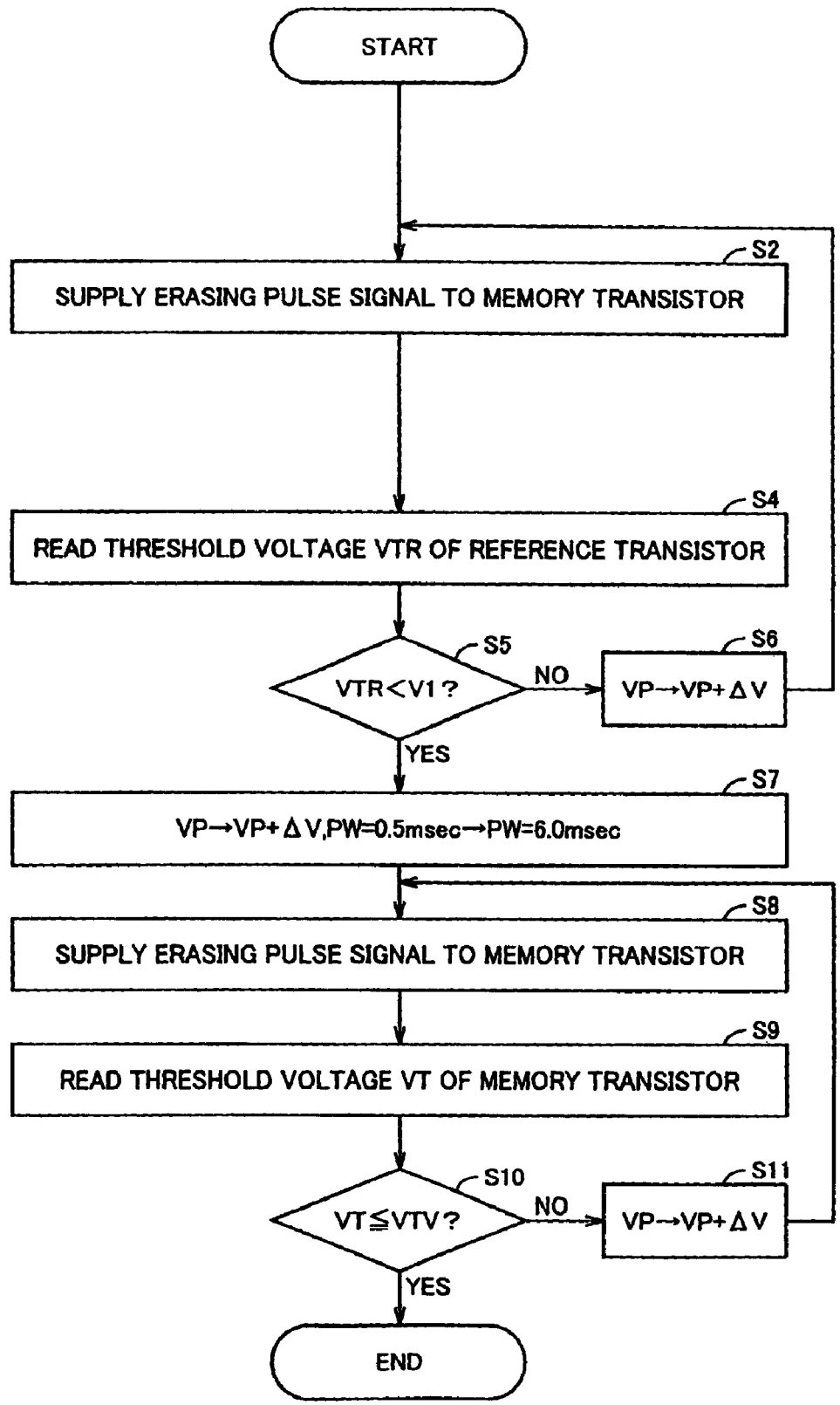
FIG. 15 is a flow chart showing an erasing operation of the flash memory shown in FIG. 14.

FIG. 15 is a flow chart illustrating the erasing operation of this flash memory, in contrast with FIG. 7. Referring to FIG. 15, in this flash memory, steps S1, S3 are omitted, and the reading of threshold voltage VT of memory transistor 1 is not performed in the first half period. At step S2, the erasing pulse signal is supplied to well W of memory transistor 1. Since memory transistor 1 and reference transistor 6 are formed in the same well W as described above, the threshold voltages of memory transistor 1 and reference transistor 6 are decreased when the erasing pulse signal is supplied to well W. Pulse voltage VP of the initial erasing pulse signal is set at 7.5V, and the pulse width of the erasing pulse signal is set at 0.5 msec in the first half period. The interval between two erasing pulse signals is fixed at 0.1 msec throughout the periods. Control gate 3 of memory transistor 1 is set at −10V, and source 4 and drain 5 are opened.

At step S4, threshold voltage VTR of reference transistor 6 is read by read circuit 11, and at step S5, VTR is compared with reference voltage V1 by comparator 18. If VTR≧V1, at step S6, pulse voltage VP is increased by step voltage ΔV=0.1V, and thereafter returning to step S2 again, the erasing pulse signal is supplied to well W of memory transistor 1. Here, pulse voltage VP of the erasing pulse signal is set at VP=7.5+0.1=7.6V. Steps S2, S4–S6 are repeatedly performed until VTR<V1. Steps S7–S11 are performed similar to the first embodiment, and description thereof will not be repeated.

In the third embodiment, the selected memory transistor 1 in memory block BLK is used as reference transistor 6, and the pulse width of the erasing pulse signal is increased in response to threshold voltage VTR of reference transistor 6 becoming lower than reference voltage V1. Therefore, in addition to the same effect as in the first embodiment, the required layout area is smaller, since reference transistor 6 need not be provided separately. Moreover, the required erasing time is shorter, since there is no need for reading threshold voltage VT of memory transistor 1 in the first half period.

Since threshold voltage VTR of reference transistor 6 probably corresponds to the center of the threshold distribution of memory block BLK, the erasing operation can be performed without being affected by variations in threshold voltage VT that may occur at the edge portion of the threshold distribution at a certain probability.

Although in the third embodiment, threshold voltage VTR of one memory transistor 1 has been used in determination of the switching point of the erasing condition, the mean value of threshold voltages VTR of a plurality of reference transistors 6 may be used in determination of the switching point of the erasing condition, or the mean value of currents flowing in a plurality of reference transistors 6 may be used in determination of the switching point of the erasing condition. A plurality of memory transistors 1 connected to one bit line BL may be used as a plurality of reference transistors 6, or a plurality of memory transistors 1 connected to one word line WL may be used as a plurality of reference transistors 6. In this case, even if a malfunction occurs to one reference transistor 6, an error in erasing control can be limited to a lesser extent. In addition, the effect of characteristic variations of reference transistor 6 can be prevented, and the center of the threshold distribution of memory block BLK can be monitored more stably.

[Fourth Embodiment]

Figure 16:
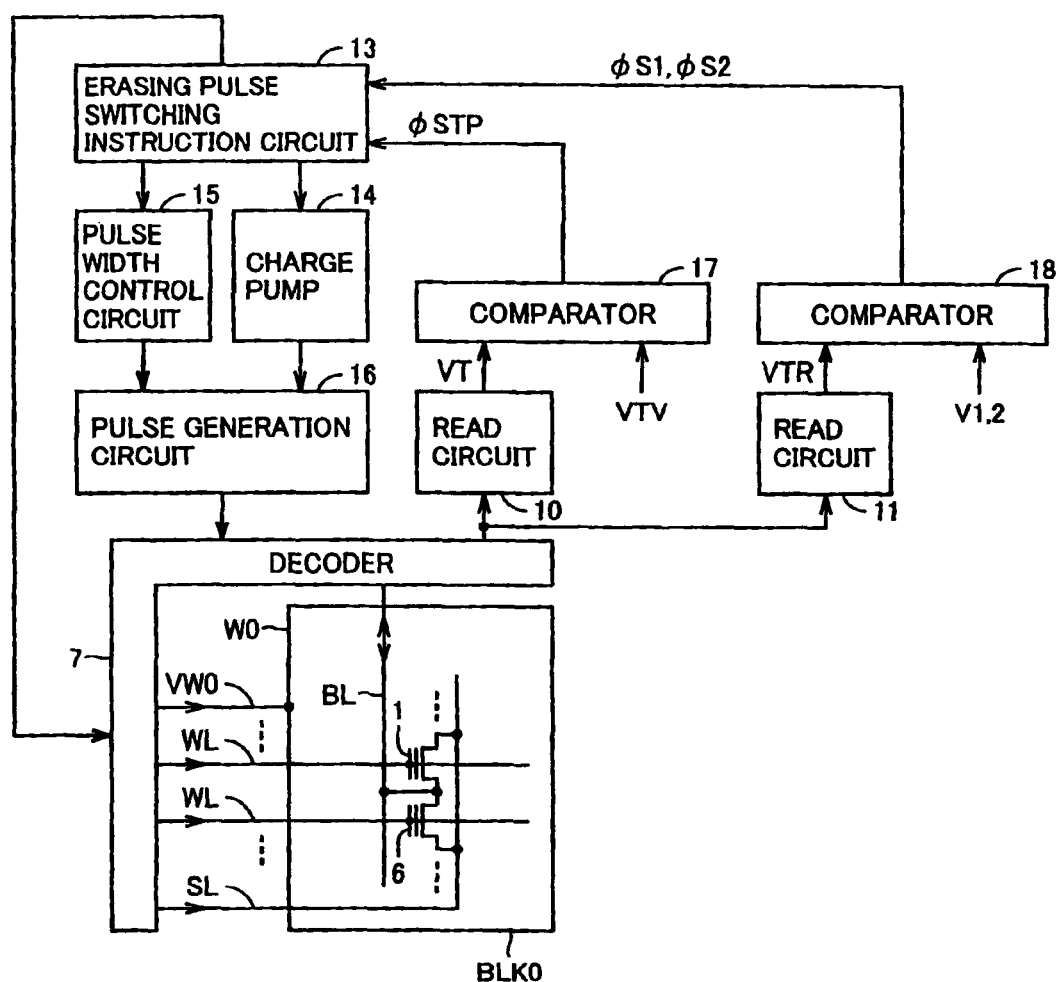
FIG. 16 is a circuit block diagram showing a main part of a flash memory in accordance with a fourth embodiment of the present invention.

FIG. 16 is a circuit block diagram showing a part in connection with data erasing in a flash memory in accordance with a fourth embodiment of the present invention, in contrast with FIG. 14. In FIG. 16, comparator 18 compares threshold voltage VTR of reference transistor 6 detected by read circuit 11 with reference voltage V1, sets signal φS1 to "H" level if VTR≧V1, and sets signal φS1 to "L" level if VTR<V1. Comparator 18 also compares threshold voltage VTR of reference transistor 6 detected by read circuit 11 with reference voltage V2, sets signal φS2 to "H" level if VTR≧V2, and sets signal φS2 to "L" level if VTR<V2. Threshold voltage VTR of reference transistor 6 probably corresponds to the center of the threshold distribution of memory block BLK. Therefore, if the upper limit value of the threshold distribution is shifted from the center by 0.5V, reference voltage V2 is set at 2.5V, which is 0.5V lower than reference voltage VTR2 shown in FIG. 13.

Figure 17:
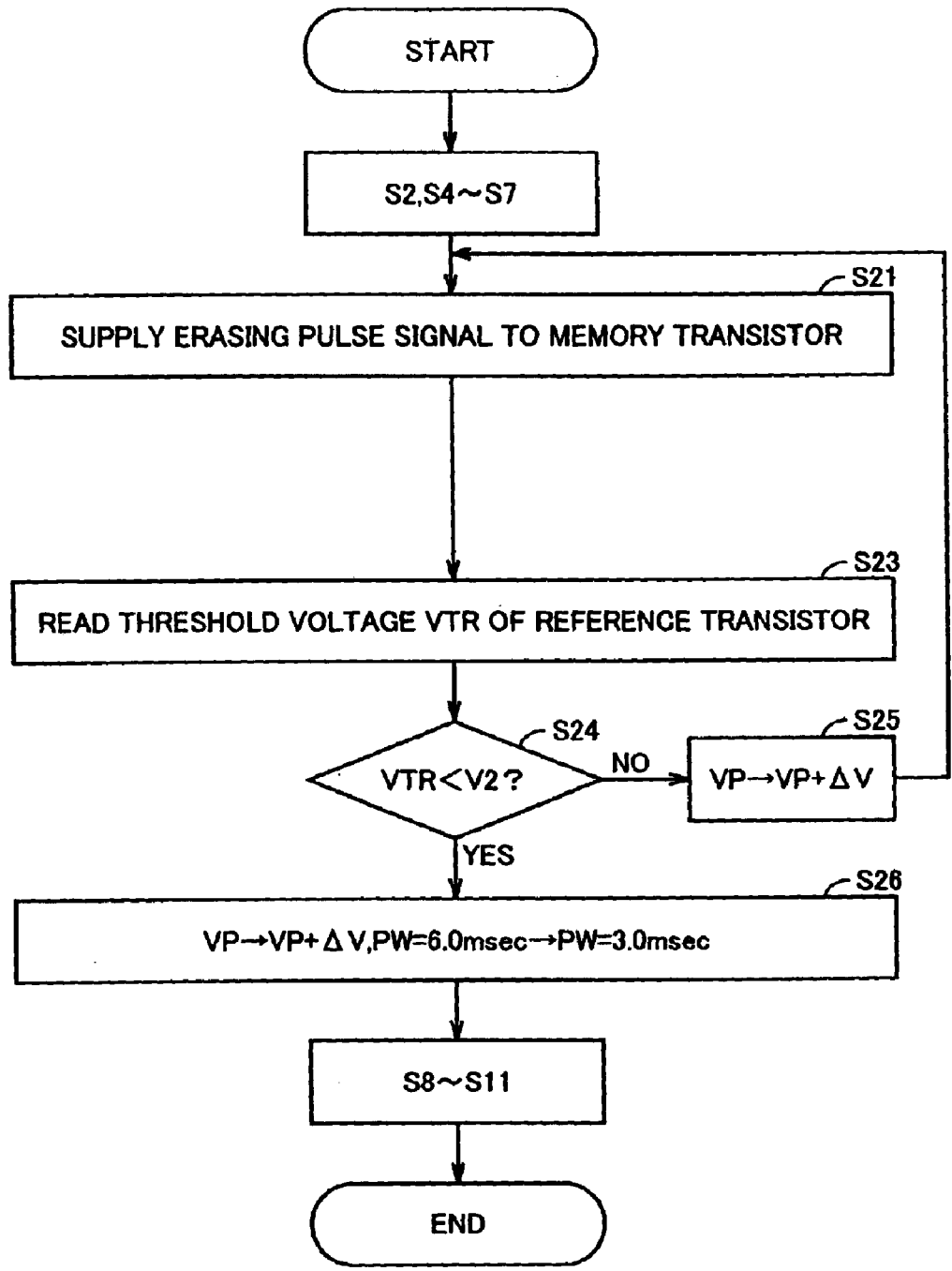
FIG. 17 is a flow chart showing an erasing operation of the flash memory shown in FIG. 16.

FIG. 17 is a flow chart illustrating the erasing operation of the flash memory shown in FIG. 16. Referring to FIG. 17, in this flash memory, steps S21, S23–S26 are performed between steps S7 and S8 in FIG. 15. At step S21 following step S7, the erasing pulse signal is supplied to well W of memory transistor 1 and reference transistor 6. The pulse width of this erasing pulse signal is set at 6.0 msec. Assuming that pulse voltage VP of the last erasing pulse signal in the first half period was 7.9V, pulse voltage VP of the initial erasing pulse signal in the latter half period is 8.0 V.

Then, at step S23, threshold voltage VTR of reference transistor 6 is read by read circuit 11, and at step S24, VTR is compared with reference voltage V2 by comparator 18. If VTR≧V2, at step S25, pulse voltage VP is increased by step voltage ΔV=0.1V, and thereafter returning to step S21 again, the erasing pulse signal is supplied to memory transistor 1 and reference transistor 6. Here, pulse voltage VP of the erasing pulse signal is set at VP=8.0+0.1=8.1V. Steps S21, S23–S25 are repeatedly performed until VTR<V2.

When VT<VTR2, at step S26, pulse voltage VP is increased by step voltage ΔV=0.1V, and in addition, pulse width PW is switched from 6.0 msec to 3.0 msec. At step S8, the erasing pulse signal is supplied to memory transistor 1. Assuming that pulse voltage VP of the last erasing pulse signal in the latter half period was 8.3V, pulse voltage VP of the initial erasing pulse signal in the last period is 8.4V. Steps S8–S11 are performed similar to the first embodiment, and description thereof will not be repeated.

In the fourth embodiment, in addition to the effect as in the third embodiment, the required erasing time is shorter, since threshold voltage VT of memory transistor 1 of which threshold voltage VT hardly changes is decreased quickly, by increasing again the rising speed of the pulse voltage of the erasing pulse signal in the last period of the erasing operation.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A nonvolatile semiconductor memory device formed on a surface of a semiconductor substrate, comprising:

a memory transistor having a floating gate and a control gate successively formed above a first well region of said semiconductor substrate, having its threshold voltage set to a first voltage for storing a data signal at a first logic level, and having its threshold voltage set to a second voltage level for storing a data signal at a second logic level;

a reference transistor having a floating gate and a control gate successively formed above a second well region of said semiconductor substrate, and having its threshold voltage set to a reference voltage between said first and second voltages;

a read circuit reading the threshold voltages of said memory transistor and said reference transistor;

a comparison circuit comparing the threshold voltage of said memory transistor read by said read circuit with the threshold voltage of said reference transistor read by said read circuit and outputting a pulse waveform instruction signal based on a comparison result; and a data signal rewriting circuit supplying a pulse signal train having a pulse waveform in accordance with said pulse waveform instruction signal between the control gate of said memory transistor and said first well region and changing the threshold voltage of said memory transistor from said first voltage to said second voltage.

2. The nonvolatile semiconductor memory device according to claim 1, comprising a plurality of reference transistors, threshold voltages of said plurality of reference transistors being set respectively to a plurality of reference voltages different from each other, wherein said read circuit reads the threshold voltages of said memory transistor and said plurality of reference transistors, and said comparison circuit compares the threshold voltage of said memory transistor read by said read circuit with each of the threshold voltages of said plurality of reference transistors read by said read circuit and outputs said pulse waveform instruction signal based on a comparison result.

3. The nonvolatile semiconductor memory device according to claim 1, comprising a plurality of reference transistors, threshold voltages of said plurality of reference transistors being set together to said reference voltage, wherein said read circuit reads the threshold voltage of said memory transistor and a mean value of the threshold voltages of said plurality of reference transistors, and said comparison circuit compares the threshold voltage of said memory transistor read by said read circuit with the mean value of the threshold voltages of said plurality of reference transistors read by said read circuit and outputs said pulse waveform instruction signal based on a comparison result.

4. The nonvolatile semiconductor memory device according to claim 1, comprising:

a plurality of memory blocks each including a plurality of memory transistors;

a plurality of reference transistors provided respectively corresponding to said plurality of memory blocks; and a decoder selecting any memory block of said plurality of memory blocks and any memory transistor of a plurality of memory transistors belonging to the memory block, and a reference transistor corresponding to the memory block, in accordance with an address signal, wherein said read circuit reads the threshold voltages of the memory transistor and the reference transistor selected by said decoder, and said data signal rewriting circuit changes the threshold voltage of the memory transistor selected by said decoder from said first voltage to said second voltage.

5. A nonvolatile semiconductor memory device formed on a surface of a semiconductor substrate, comprising:

a reference transistor and a memory transistor, each having a floating gate and a control gate successively formed above a well region of said semiconductor substrate, having its threshold voltage set to a first voltage for storing a data signal at a first logic value, and having its threshold voltage to a second voltage for storing a data signal at a second logic level;

a read circuit reading the threshold voltage of said reference transistor;

a comparison circuit comparing the threshold voltage of said reference transistor read by said read circuit with a reference voltage between said first and second voltages and outputting a pulse waveform instruction signal based on a comparison result; and a data signal rewriting circuit supplying a pulse signal train having a pulse waveform in accordance with said pulse waveform instruction signal between the control gate of each of said reference transistor and said memory transistor and said well region and changing each of the threshold voltages of said reference transistor and said memory transistor from said first voltage to said second voltage.

6. The nonvolatile semiconductor memory device according to claim 5, wherein said comparison circuit compares the threshold voltage of said reference transistor read by said read circuit with each of a plurality of reference voltages different from each other between said first and second voltages and outputs said pulse waveform instruction signal based on a comparison result.

7. The nonvolatile semiconductor memory device according to claim 5, comprising a plurality of reference transistors, wherein said read circuit reads a mean value of threshold voltages of said plurality of reference transistors, and said comparison circuit compares said reference voltage with the mean value of threshold voltages of said plurality of reference transistors and outputs said pulse waveform instruction signal based on a comparison result.

8. A nonvolatile semiconductor memory device formed on a surface of a semiconductor substrate, comprising:

a memory transistor having a floating gate and a control gate successively formed above a first well region of said semiconductor substrate, having its threshold voltage set to a first voltage for storing a data signal at a first logic level, and having its threshold voltage set to a second voltage lower than said first voltage for storing a data signal at a second logic level;

a first read circuit reading the threshold voltage of said memory transistor;

a voltage generation circuit generating a third voltage between said first and second voltages;

a comparison circuit comparing the threshold voltage of said memory transistor read by said first read circuit with said third voltage generated by said voltage generation circuit, outputting a first pulse waveform instruction signal, if the threshold voltage of said memory transistor is between said first and third voltages, and outputting a second pulse waveform instruction signal, if the threshold voltage of said memory transistor is between said third and second voltages; and a data signal rewriting circuit supplying a pulse signal train between the control gate of said memory transistor and said first well region and decreasing the threshold voltage of said memory transistor from said first voltage to said second voltage, wherein said data signal rewriting circuit keeps a pulse signal interval constant, continuously raises an amplitude voltage of said pulse signal train by a prescribed value per one pulse signal, sets each pulse signal width at a first width, if said first pulse waveform instruction signal is output from said comparison circuit, and sets each pulse signal width at a second width greater than said first width, if said second pulse waveform instruction signal is output from said comparison circuit.

9. The nonvolatile semiconductor memory device according to claim 8, wherein said voltage generation circuit includes a reference transistor having a floating gate and a control gate successively formed above a second well region of said semiconductor substrate, and having its threshold voltage set to said third voltage, and a second read circuit reading the threshold voltage of said reference transistor.

10. The nonvolatile semiconductor memory device according to claim 8, wherein said voltage generation circuit further generates a fourth voltage between said third and second voltages, said comparison circuit further compares the threshold voltage of said memory transistor read by said first read circuit with said fourth voltage generated by said voltage generation circuit and outputs a third pulse waveform instruction signal if the threshold voltage of said memory transistor is between said fourth and second voltages, and said data signal rewriting circuit further sets each pulse signal width at a third width smaller than said second width if said third pulse waveform instruction signal is output from said comparison circuit.

* * * * *